United States Patent [19]
Ronen

[11] 4,404,576
[45] Sep. 13, 1983

[54] ALL IMPLANTED MOS TRANSISTOR

[75] Inventor: Ram S. Ronen, Placentia, Calif.

[73] Assignee: Xerox Corporation, Stamford, Conn.

[21] Appl. No.: 157,744

[22] Filed: Jun. 9, 1980

[51] Int. Cl.³ .............................................. H01L 29/78
[52] U.S. Cl. ......................................... 357/23; 357/41; 357/91
[58] Field of Search ...................... 357/23 VD, 41, 91

[56] References Cited
U.S. PATENT DOCUMENTS

| | | | |
|---|---|---|---|
| 4,190,850 | 2/1980 | Tihanyi | 357/23 VD |
| 4,288,806 | 9/1981 | Ronen | 357/23 VD |
| 4,291,321 | 9/1981 | Pfleiderer | 357/23 VD |
| 4,329,186 | 5/1982 | Kotecha | 357/23 VD |

Primary Examiner—Martin H. Edlow

[57] ABSTRACT

A MOSFET structure having DMOS characteristics fabricated using all implantation only without the use of time-consuming diffusion. Particularly the critical length of the channel is controlled by beveling one edge of an oxide layer to a predetermined slope thereby allowing transferral of ions to the substrate through the beveled edge only to a predetermined depth thereof before being completely shielded. The result is a channel having a closely controlled length to thus be relatively very short for very fast switching of low or high voltage signals.

11 Claims, 15 Drawing Figures

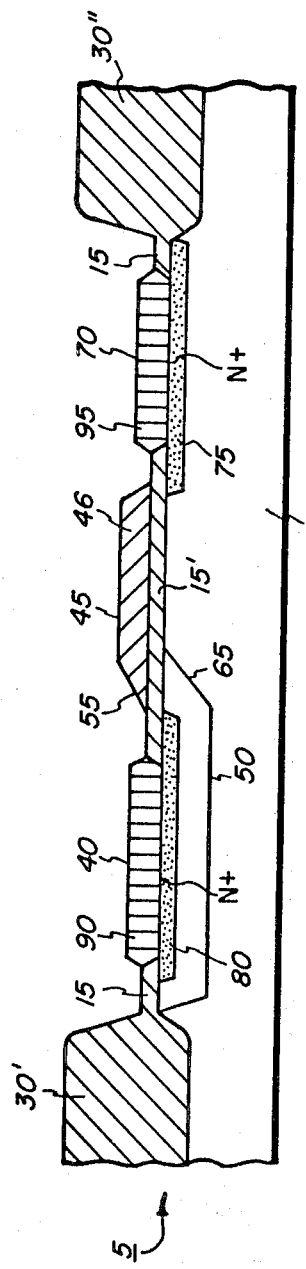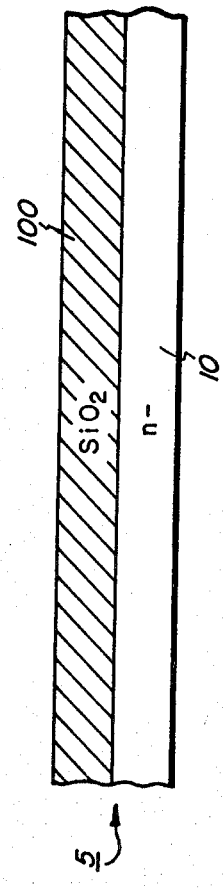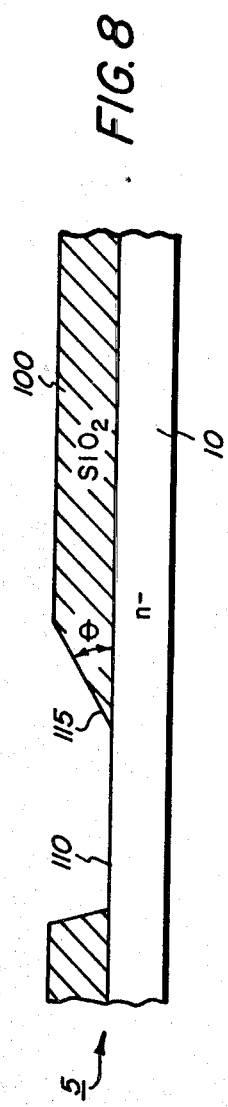

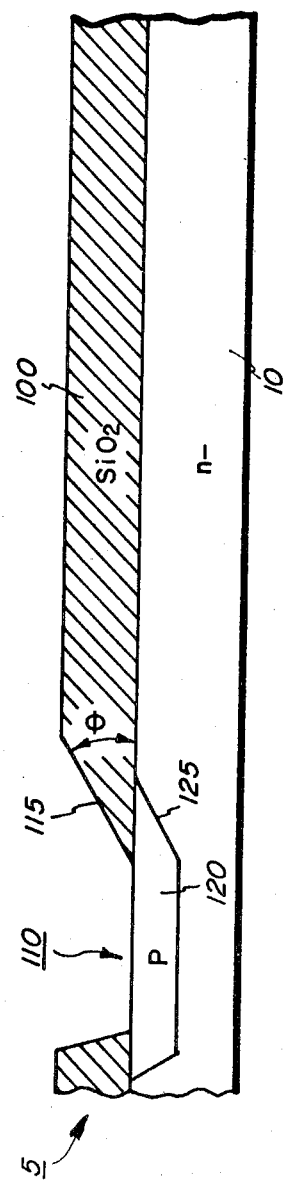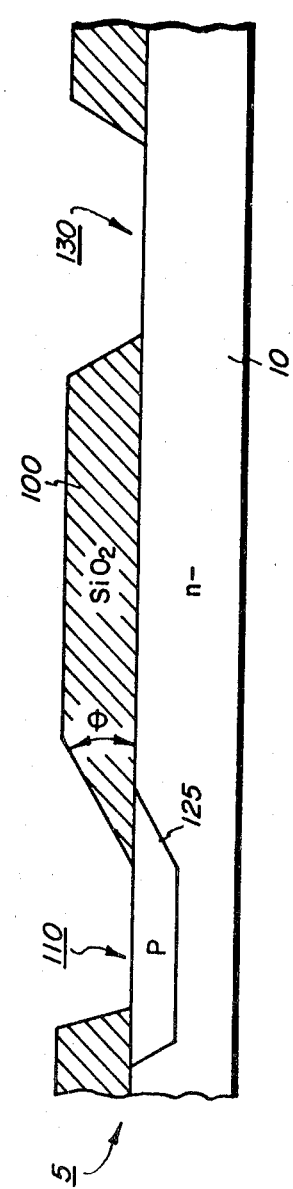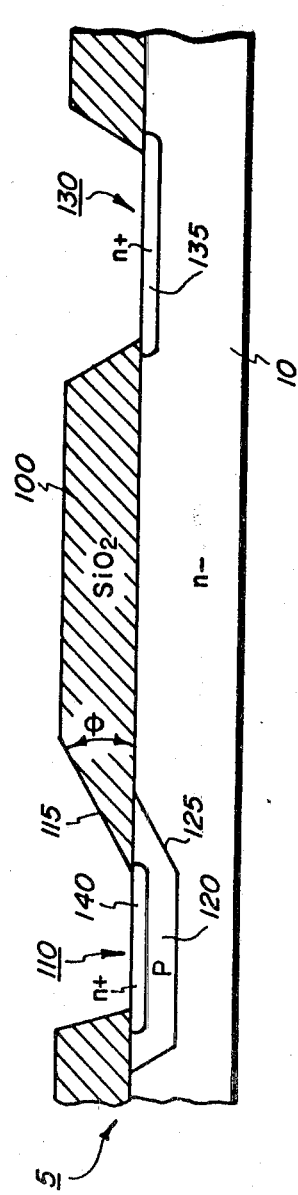

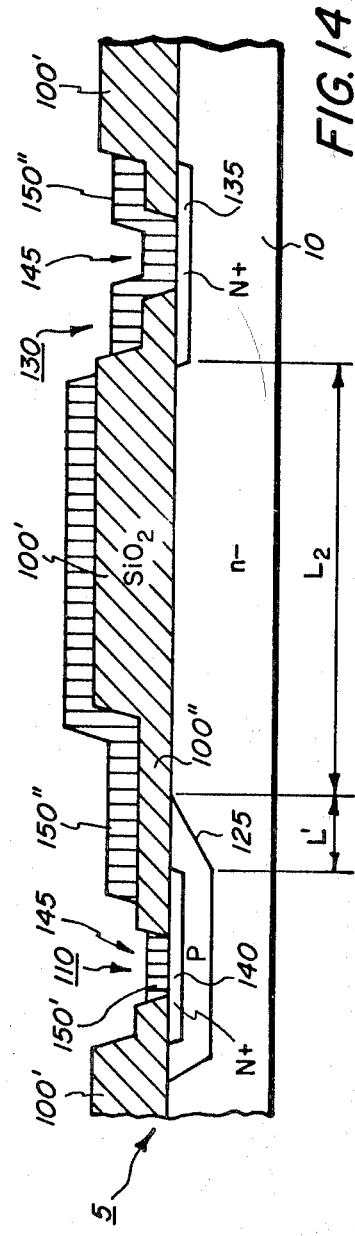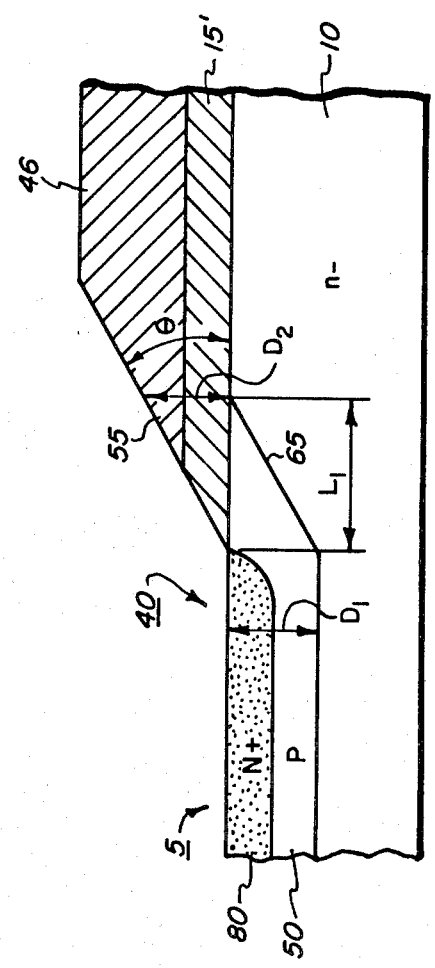

ALL IMPLANTED MOS TRANSISTOR

BACKGROUND OF THE INVENTION

A. Field of the Invention

This invention relates to MOSFET's.

B. Prior Art

In the past, only DMOS devices using relatively time-consuming diffusion could obtain the closely controlled relatively short channel lengths required for high speed operation.

SUMMARY OF THE INVENTION

It is an important object of the invention to provide a means for fabricating a MOSFET having a DMOS-like structure that may be formed as a relatively closely controlled channel using implantation only, with no long diffusion or drive.

It is a further important object of the invention to provide a means for fabricating the above MOSFET so that its channel is relatively short.

It is a further important object of the invention to provide a means for fabricating the above MOSFET so that its channel is relatively long.

It is also an important object of the invention to provide a means for fabricating the above MOSFET to function as a very fast switching device.

It is also an important object of the invention to provide a means for fabricating the above MOSFET as a very high-frequency high-gain amplifier.

It is also an important object of the invention to provide a means for fabricating the above MOSFET to function as a low-voltage device.

It is also an important object of the invention to provide a means for fabricating the above MOSFET to function as a high-voltage device.

It is yet another important object of the invention to provide a means for beveling at a given angle an edge of an oxide, disposed on a substrate in such a manner as the angle of bevel will determine the vertical cross-section of oxide and thus the degree of ion flow-through for penetration into the substrate to form a channel.

BRIEF DESCRIPTION OF THE DRAWINGS

Various other objects, advantages and meritorious features of the invention will become more fully apparent from the following specification, appended claims and accompanying drawing sheets.

The features of a specific embodiment of the invention are illustrated in the drawings, in which:

FIG. 6 is a cross-sectional schematic representation of the IMOS at the completion of the sixth step of the first embodiment.

FIG. 7 is a cross-sectional schematic representation of the IMOS at the completion of the first step of the second embodiment.

FIG. 8 is a cross-sectional schematic representation of the IMOS at the completion of the second step of the second embodiment.

FIG. 9 is a cross-sectional schematic representation of the IMOS at the completion of the third step of the second embodiment.

FIG. 10 is a cross-sectional schematic representation of the IMOS at the completion of the fourth step of the second embodiment.

FIG. 11 is a cross-sectional schematic representation of the IMOS at the completion of the fifth step of the second embodiment.

FIG. 14 is a cross-sectional schematic representation of the IMOS at the completion of the eighth step of the second embodiment.

FIG. 15 is a cross-sectional schematic representation of the IMOS at the completion of the eighth step of the second embodiment of FIG. 14 in the channel area.

DETAILED DESCRIPTION OF THE PREFERRED EMBODIMENT

Figure 1:
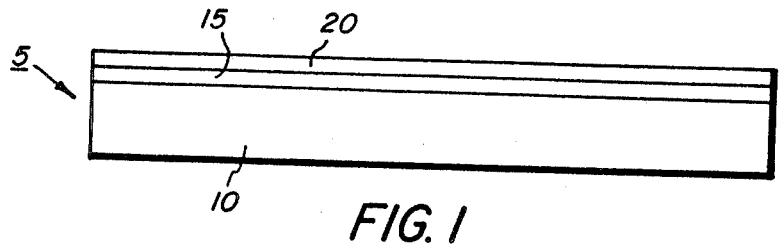
FIG. 1 is a cross-sectional schematic representation of the IMOS at the completion of the first step of the first embodiment.

Referring particularly to FIGS. 1 through 15 of the drawings by the characters of reference there is illustrated an IMOS or all implanted MOSFET for carrying out the objects of the invention.

The inventive all implanted MOS or IMOS type of MOSFET device 5, as shown in FIG. 6 for the first embodiment as described infra, comprises a relatively lightly N minus (−) doped with boron silicon substrate 10. In regards to the source for the AIMOS 5, an N plus (+) doped sub-source area 80 is operative to function as the actual source area and, in addition, a p doped source area 50 has been implanted as a means of operatively forming the channel area 65 of length L1, see FIGS. 14 and 15. In regards to the drain for the IMOS 5, an N plus (+) area 75 has been implanted or doped in the substrate 10. Field oxide 30' and 30" on either side of the IMOS device 5 acts as an electrical field inversion buffer therefor. Ohmic contacts 90 and 95 of a conductive material or metal are disposed above and in operative contact with the sub-source area 80 and drain area 75 in the source and drain regions 40/70. Wherever the field oxide 30'/30" and ohmic contacts 90/95 do not cover the substrate 10, a layer of silicon dioxide (SiO$_2$) 15/15' is operative to do so. A polysilicon gate 46 in the gate region 45 is disposed above and in operative contact with the SiO$_2$ layer 15' is the vicinity of the channel area 65 of length L1 and the drift region defined as length L2. It will be noted and particularly appreciated that the length L1 of the channel area 65 can be closely controlled by the gradient of the beveled edge 55 on the side of the gate area 46 adjacent the source region 40.

The concept of all implanting a MOSFET particularly in regards to the closely controlled length L1 of the channel area 65 for the IMOS device 5, as shown in FIG. 6, makes it possible to fabricate extremely relatively short-channel and relatively long channel MOSFET's in a relatively simple manner as to process control. Moreover, the resulting devices such as the IMOS 5 have a structure similar to that of a double-diffused MOS (DMOS), but without the associated fabrication difficulties such as double diffusion/drive, or the doping profile characteristics of DMOS. The channel doping for the IMOS 5 can be uniform almost to the end. The structures for the IMOS 5 can be used for extremely fast LSI circuits, whether single channel or complementary. It also can be used for circuits with relatively short or long channel devices. With such features, it can be used as a driver device or as a load device, performing as an enhancement or depletion MOSFET in either case. In addition, it may be used for LSI circuits with low and high voltage MOSFET. Finally, it may be used for bulk as well as SOS circuits.

Figure 3:
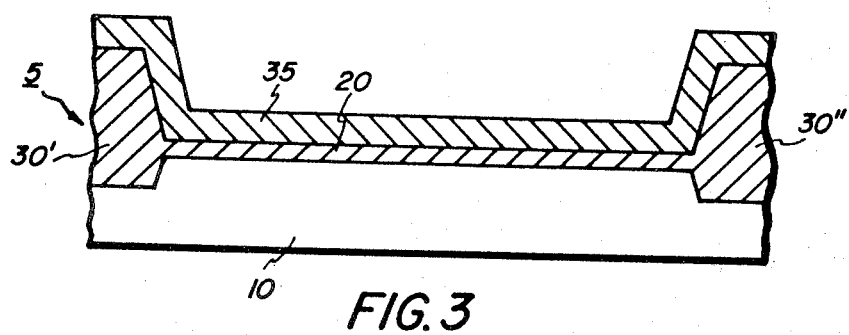
FIG. 3 is a cross-sectional schematic representation of the IMOS at the completion of the third step of the first embodiment.

A very simple fabrication process for the IMOS 5 in FIG. 6 makes use of the fact that a relatively thin silicon dioxide layer 15' and relatively thick polysilicon layer 46 make a good combination for an easily performed process (or even a relatively thick silicon dioxide layer 100 along as in FIG. 11 of the second embodiment). Moreover, by applying ion-implantation to the top surface of the polysilicon 46, using a shallow argon or oxidon ion implant, enough damage can be created so that the polysilicon 46 and oxide 15 slopes or edges 55 are relatively gradual. Accordingly an angle (theta) of etching can then be obtained to arrive at the desired length L1 for the channel area 65. In particular, the gradient of the bevel of the edge 55 may be controlled by a relatively well known prior art process, but which has never been used in the present application to make the subject invention. The prior art process is variously known as ion implantation mask or radiation damaged mask or receding mask method. If, as in the first embodiment, a polysilicon layer 35 and silicon dioxide layer 20 are applied to a substrate 10 as is shown in FIG. 3, and then before a photoresist layer (not shown) is applied, an ion implantation is made to intentionally damage only the surface of the polysilicon layer 35 at a predetermined relatively shallow depth. The damage consists of knocking ions out of position in the surface or predetermined relatively shallow depth of the polysilicon layer 35. This type of damage makes the surface of the layer 35 more vulnerable to removal by normal or isotropic etching (note that nonisotropic etching could be used for crystalline polysilicon (not shown) also). The ion damage in the surface itself is proportional to the degree of ion implantation which is a factor of duration, dosage and KV energy. Thus once the intentional damage has been made to the surface of the polysilicon layer 35, then a photoresist layer (not shown) may be applied, and exposed in the source region 40, and etched with an acid bath solution to remove the photoresist layer in the source region 40. In normal or isotropic etching, if a predetermined area is etched away, the side walls or edges of the area will be sloped at a 45 degree angle (this is without ion damage). If, though, ion damage is used, as in the present invention, then the relatively horizontal surface of the polysilicon layer 46 will be washed or etched away at a relatively faster rate than the undamaged relatively vertical polysilicon thus the ion damaging will give the slope or gradient of the beveled edge a predetermined value of less than one. The precise slope being a function of the amount of damaging. Using a word of art, as to the supra process, the mask receded at a predetermined rate to give a slope less than one since the damaged surface area (horizontal) erodes away at a relatively faster rate than the nondamaged area (vertical). Put another way, the wall or damaged area of edge 55 (equitably functioning as a mask) keeps moving or growing backwards. Thus, since the amount of damage can be precisely predeterminably controlled by the amount of ion implantation, the gradient of the beveled edge can also be precisely controlled. As a result, the predetermined beveled edge 55 in the layer 46, by its thickness, will determine whether a subsequent ion implantation into layer 46 will pass through at any point into the substrate 10 to form the channel area 65 and thus also precisely determine the length (L1) of the channel area 65.

It will be appreciated that since the process for masking the IMOS device 5 can easily be implemented, making the device 5 symmetrical (not shown) is relatively not any more of a problem than making asymmetrical as shown in FIG. 6. It will be further appreciated that the IMOS device 5 can be reversed doped or implanted which is to say what is N doped or NMOS can be made to be p doped or PMOS and vice versa without inhibiting or otherwise obviating the present invention.

The structure of the IMOS device 5, as shown in FIG. 6, appears similar to a DMOS device which is to say a double-diffused MOS, but which no longer requires diffusion to define the channel 65 as described infra. Particularly, the relatively short channel 65 of the IMOS device 5 is achieved by means of a relatively quick implantation through a slanted, sloped, or beveled edge 55 of an oxide/nitride sandwich, oxide/polysilicon or any combination thereof. It will be appreciated that in the first embodiment, as shown in FIG. 6, that an oxide layer 15' and polysilicon layer 46 combination was used for implantation.

The complete process as described infra is simple, requires no time-consuming long diffusions, and can result in relatively very short controlled channels 65. Using the described process for obtaining a desired gradient to a beveled edge 55 in the polysilicon layer 46, where a relatively slow diffusion such as is used (that is, a very short range and straddle), a desired angle (theta) can be obtained as shown generally in FIG. 4 and specifically in FIG. 15. Using the parameter D1 for maximum penetration depth (that is, range) of the implant giving source area p (50) in the N− silicon substrate, D2 for the maximum depth of the beveled edge 55 in the $SiO_2$ layer 15' and polysilicon layer 46 combination having a predetermined gradient or angle (theta) which the implant must penetrate to reach the desired channel area 65 in the substrate 10, we obtain the equation for the length (L1) of the channel area 65 which is D2 times the cotangent of the angle (theta). It will be appreciated that D2 depends on the species being implanted (that is, the type of ions which is arsenic here) and the medium where implantation occurs (that is, in this case, $SiO_2$ layer 15' and polysilicon layer 46 combination). The angle (theta) depends on the method of etching the sloped edge 55, the material of the edge 55 ($SiO_2$ or polysilicon) and the masking method. By damaging the surface of the polysilicon layer 46 prior to definition and etching, a slope on edge 55 of less than 45 degrees can be achieved, with respect to the substrate. The carrier concentration in the channel area 65 along its length L1 is not absolutely constant due to the limited straddle of the implanted species and the variable depth of the peak implant under L1, and in most applications, it need not be constant and uniform. For those few applications where it might be so needed to have a relatively constant carrier concentration in the channel area 65, the situation can be rectified or modified by a drive longer than just an activation before N+ doping as elaborated on in the infra process description. It can also be modified by a multiple implant of the channel area or species 65, namely, Boron (B) in the supra case.

After the channel area 120 has been defined by implantation, as shown in FIG. 11 of the second embodiment, and the drain and source area 120/135 are either to be defined or already have, various subembodiments of the second embodiment exist in regards to $SiO_2$ layer 100 over the channel area 120 and the drift region defined as length L2 (in FIG. 14). As described in great detail infra in the process description for the second embodiment, the thick oxide or $SiO_2$ layer 100 can be stripped, and a new relatively thick oxide layer 100' grown. The thick oxide layer 100' can be masked in part, and etched back over the channel area 120, or etched away in a defined region such as the source region 110 and regrown a layer 100'' as is the case here. As a result, one will have a split oxide structure 100' and 100'' which will result in a relatively very higher breakdown voltage between gate contract 150''' and drain area 135 and between drain area 135 and substrate 10. It will be appreciated that a polygate 150''' can be deposited and defined as used in the first embodiment could be alternatively used here. In particular, a sloped edge 115 in FIG. 10 of a polysilicon layer (not shown) and $SiO_2$ layer 100 could also be used to define the short channel area 120. This would result in a self-aligned structure with some relative overlap therebetween.

It will be further appreciated that the process used to arrive at a relatively short channel area using only ion implantation could proceed in various ways including a deep drain junction (not shown) without detracting from the concept of the present invention. It will also be further appreciated that the angle (theta) may be adjusted by means of a variable opening method, that is, damage the surface of the polysilicon layer 46 shown in FIG. 4 of the first embodiment below the photoresist layer (not shown).

For an IMOS device 5 that is relatively self-aligned and self-registering in a first embodiment of the present invention that is non-symmetric as a first major step in the process for creating an IMOS device 5 having multiple substeps as shown in FIG. 1, a silicon (Si) substrate 10 that is lightly N minus (−) doped is operative to have a silicon dioxide ($SiO_2$) layer 15 thermally formed or grown to a predetermined depth on the surface of the substrate 10. A layer 20 of silicon nitride ($Si_3N_4$) is next deposited to a predetermined depth over the $SiO_2$ layer 15 by use of chemical vapor deposition.

Figure 2:
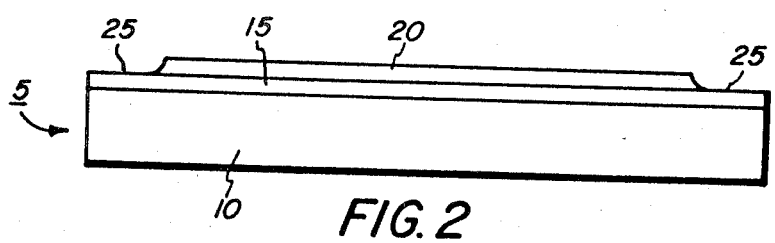
FIG. 2 is a cross-sectional schematic representation of the IMOS at the completion of the second step of the first embodiment.

As a second major step in the process for creating an IMOS device 5 having multiple substeps as shown in FIG. 2, a nitride layer, $Si_3N_4$ is laid down. Next, selective nitride etching or removal of the $Si_3N_4$ layer 20 is used to leave the windows 25 exposed to the surface of the $SiO_2$ layer 15. These bare areas will ultimately become source, drain and contacts. The remaining $SiO_2$ layer 15 defines the channel oxide as will be explained infra.

As a third major step in the process for creating an IMOS device 5 having multiple substeps, as shown in FIG. 3, a field oxide (FO) of $SiO_2$ is thermally formed or grown in windows 25 insomuch as the $SiO_2$ layer 15 reacts with the atmosphere where so exposed and with the substrate 10 itself to form field oxide areas to a predetermined height above the layer 15 and a predetermined depth below the layer 15 so that the field oxide areas 30' and 30'' are relatively higher than they are deeper with respect to the layer 15. Next the remaining nitride layer 20 is etched away with an acid solution. Finally, a polysilicon film or layer 35 is laid down or deposited to a predetermined depth over the surface of the $SiO_2$ layer 15 and field oxide area 30' and 30''. It will be appreciated that the polysilicon layer 35 can be relatively thick as compared to the $SiO_2$ layer 20.

Figure 4:
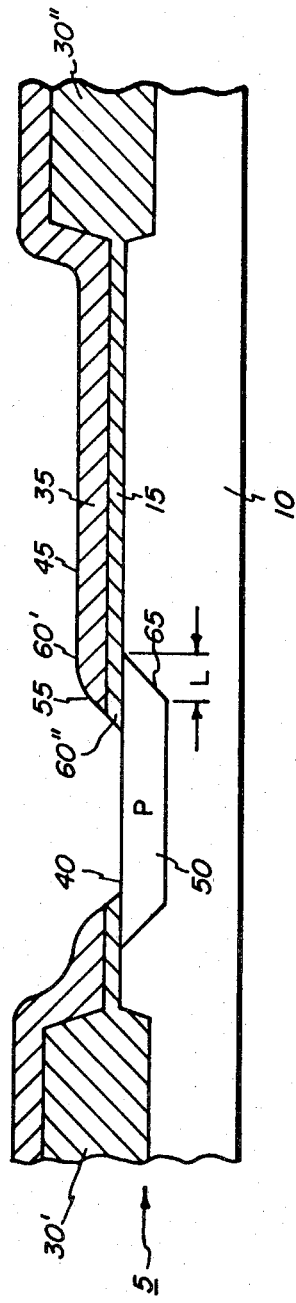
FIG. 4 is a cross-sectional schematic representation of the IMOS at the completion of the fourth step of the first embodiment.

As a fourth major step in the process for creating an IMOS device 5 having multiple substeps, as shown in FIG. 4. As described in detail supra in the specification, a predetermined ion implantation with argon or other suitable element, is made to the surface of the polysilicon layer 35 at a relatively shallow predetermined depth sufficient to damage the surface of the polysilicon so as to enable faster etching of the surface to the degree required to subsequently give the angle of gradient (theta) to the infra formed beveled edge 55. A photolithographic subprocess including substeps of depositing a layer of photoresist (not shown), masking and exposing a selected area with ultraviolet (UV) light, and etching away the exposed area as an opening down to the surface of the substrate 10 with an acid bath solution thereby defining the source region 40 for a source area 50 and one side of the gate region 45 or a gate area 46 adjacent thereto. A boron implant at a desired concentration is then made through the exposed area of the substrate 5 corresponding to the source region 40 to p implant a source area 50. It will be appreciated that the $SiO_2$ layer 20 and the polysilicon layer 35 act as a natural barrier to the ions in the implantation process to a degree determined by the layer 20/35. Accordingly, the beveled off edge 55 will relatively totally impede ions at its top edge 60' and relatively nonimpede ions at its bottom edge 60''. As explained supra, the angle or gradient of the beveled edge will determine the amount of ions allowed to pass through for any vertical subsection of the layers 20 and 35. Thus the length (L1) of the channel 65 underneath the beveled edge 55 will be determined by the gradient or angle (theta) of the beveled edge 55.

Figure 5:
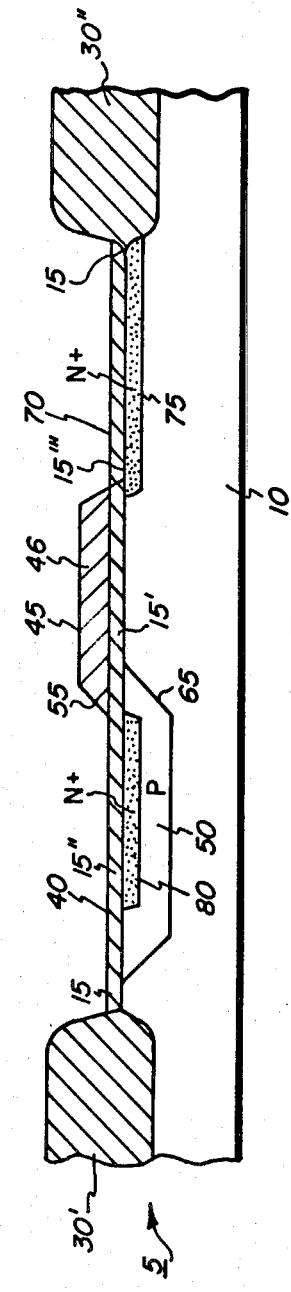
FIG. 5 is a cross-sectional schematic representation of the IMOS at the completion of the fifth step of the first embodiment.

As a fifth major step in the process for creating an IMOS device 5 having multiple substeps, as shown in FIG. 5, a photolithographic subprocess including substeps of depositing a layer of photoresist (not shown), masking and exposing a selected area with UV, and etching away the exposed area as an opening down to the surface of the substrate 10 with an acid bath solution thereby defining the drain region 70 and the other side of the gate region 45 for a gate area 46 adjacent thereto. Next implant or dope with arsenic (As) or phosphorous (P) at a desired concentration level at a spatially relatively predetermined shallow level an N plus (+) drain area 75 and an N plus (+) subsource area 80 within the source area 50. The bounds of the drain area 75 and subsource area 80 is the exposed surface of the substrate 10 in source and drain regions 45 and 70. It will be appreciated that the gate area 46 and underlying $SiO_2$ layer 15' is bounded by the adjacent ends of the drain area 75 and the sub-source area 80. Activate the N+ areas 75 and 80 by annealing such as laser annealing. Thermally oxidize the exposed substrate areas 10 comprising the N+ areas 75 and 80 by reacting the oxygen in the atmosphere with the silicon in the substrate 10 with heat to form sublayers 15" and 15'" thereby forming an oxide layer continum consisting of areas 15, 15', 15" and 15'".

As a sixth major step in the process for creating an IMOS device 5 having multiple substeps, as shown in FIG. 6 uniformly depositing a layer 85 of a conductive metal such as Aluminum (Al) on the surface of the IMOS 5, a photolithographic subprocess including substeps of depositing a layer of photoresist (not shown), masking and exposing a selected area with UV, and etching away the exposed area as an opening down to the surface of the IMOS 5 with an acid bath solution thereby defining the metallic ohmic contacts for source and drain 90 and 95.

It will be appreciated that the supra first embodiment for an IMOS device 5, it is relatively self-aligning and self-registering with gate area 46 definition relatively at the beginning. It will be further appreciated that although the first embodiment can be made to higher tolerance specifications than the second embodiment auspiciously as to the channel area 65. It will be further appreciated that switching speed for the first embodiment IMOS device 5 relatively fast as to the prior art and even as to the second embodiment.

In a second embodiment of the present invention for an IMOS device 5 that is relatively non self-aligned or self-registering, as a first major step in the process for creating an IMOS device 5 having multiple substeps as shown in FIG. 7, given a relatively lightly n minus (−) doped substrate 10 of silicon (Si), the substrate 10 is oxidized to thermally form specifically a layer 100 of silicon dioxide (SiO2) at a predetermined thickness. Alternately, rather than using an oxygen (O2) containing atmosphere, a nitrogen (N) containing atmosphere could be used with the substrate 10 to thermally form specifically a layer 100 of silicon nitride (Si3N4). Also generally alternatively, any dielectric could be used as a layer 100 to cover the substrate 10.

As a second major step in the process for creating an IMOS device 5 having multiple substeps, as shown in FIG. 8, as described in detail supra in the specification, a predetermined ion implantation with argon is made to the surface of the silicon dioxide layer 100 at a relatively shallow predetermined depth sufficient to damage the surface to the degree required to subsequently give the gradient (theta) to the infra formed beveled edge 115, a photolithographic subprocess including substeps of depositing a layer of photoresist (not shown), masking and exposing a selected area with ultraviolet (UV) light, and etching away the exposed area as an opening down to the surface of the substrate 110 with an acid bath solution thereby defining the source region 110 in the substrate 10 and more importantly, the dielectric 100 may be etched at a desired predetermined angle theta at the edge 115 adjacent to the source region 110 as part of the supra photolithographic subprocess.

As a third major step in the process for creating an IMOS device 5 having multiple substeps, as shown in FIG. 9, an implant is made with Boron (B) at a predetermined concentration and duration to reach the substrate 10 directly onto the exposed area of the substrate 10 of the source region 110 and also indirectly exposed through the edge 115 of the dielectric layer 100 where relatively thin enough to allow flow-through penetration of the implant as predetermined by the thickness of layer 100 as a function of the angle theta as explained supra. The substrate 10 where so exposed forms a p type source area 120 in the substrate 10 and a p type channel area 125 in the substrate 10 under the edge 110 of layer 100.

As a fourth major step in the process for creating an IMOS device 5 having multiple substeps, as shown in FIG. 10, a photolithographic subprocess including substeps of depositing a layer of photoresist (not shown), masking and exposing a selected area with ultraviolet (UV) light, and etching away the exposed area as an opening down to the surface of the substrate 10 with an acid bath solution thereby defining the drain region 130 in the substrate 10.

As a fifth major step in the process for creating an IMOS device having multiple substeps, as shown in FIG. 11, an implanting or doping with arsenic (As) or phosphorus (P) at a desired predetermined concentration level at a spatially relatively predetermined shallow level an N plus (+) drain area 135 and an N plus (+) sub-source area 140 within the source area 120 in substrate 10.

Figure 12:
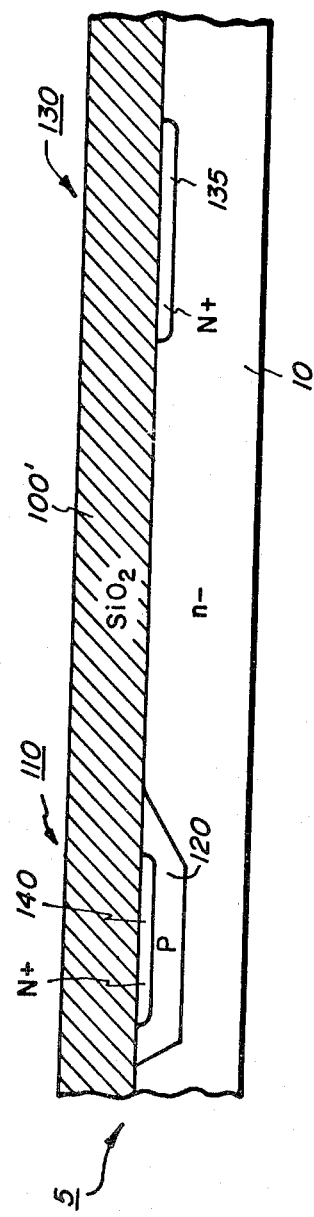
FIG. 12 is a cross-sectional schematic representation of the IMOS at the completion of the sixth step of the second embodiment.

As a sixth major step in the process for creating an IMOS device 5 having multiple substeps, as shown in FIG. 12, the SiO2 layer 100 is stripped or etched away with an acid bath solution down to the substrate of the substrate 10. Next, a new dielectric or SiO2 layer (100') is thermally formed on the substrate 10 at a predetermined depth. Next, annealing is used to activate the implants including the drain area 135 in the drain region 130 and the source area 120 and sub-source area 140 in the source region 110.

Figure 13:
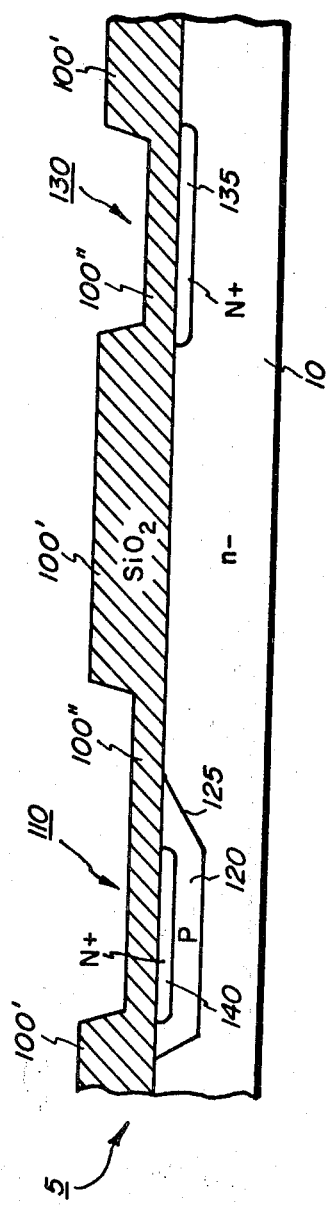
FIG. 13 is a cross-sectional schematic representation of the IMOS at the completion of the seventh step of the second embodiment.

As a seventh major step in the process for creating an IMOS device 5 having multiple substeps, as shown in FIG. 13, a photolithographic subprocess including substeps of depositing a layer of photoresist (not shown), masking and exposed (select) areas with UV light, and etching away the exposed areas as openings down to the surface of the substrate 10 with an acid bath solution thereby redefining the source and drain areas 120 and 130 of the source and drain regions 110 and 130. Next oxide is thermally regrown over the SiO2 layer 100' and the exposed substrate 10 of source and drain regions 110 and 130. The resultant relatively thick SiO2 layer is designated 100' and relatively thin SiO2 layer over the source and drain areas 120 and 130 is designated 100".

As an eighth major step in the process for creating an IMOS device 5 having multiple substeps, as shown in FIG. 14, a photolithographic subprocess including substeps of depositing a layer of photoresist (not shown), masking and exposing selected areas with UV light and etching away the exposed areas as openings, down to the surface of the substrate 10 with an acid bath solution thereby defining the open contact holes 145' and 145" for the source and drain areas 120 and 130. Next, a layer of metal or polysilicon or other conducting material is deposited over the SiO2 layer 100' and 100" and the contact holes 145' and 145" exposed to the substrate 10. A photolithographic subprocess including substeps of depositing a layer of photoresist (not shown), masking and exposing selected areas with UV light and etching away the exposed areas as openings down to the surface of the SiO2 layers 100' and 100" with an acid bath solution thereby defining an ohmic contact 150' for the source areas 120 an ohmic contact 150" for the drain area 135, and a gate plate or layer 150'". It will be appreciated that the gate plate 150'" could be subdivided into a control gate plate and a field plate wherein the field plate would be used in a relatively high-voltage (HV) environment for deflecting the high-voltage field lines away from the drain area 135. It will be also appreciated that L1 represents the length of the channel area 125 and L2 represents the length of the drift region. It will be further appreciated that electrodes (not shown) may be attached to the source ohmic contact 150′, the drain ohmic contact 150″, and the gate plate 150‴.

It will be appreciated that the second embodiment for an IMOS device 5 has relatively no self-alignment or self-registration with gate definition relatively at the end. Although the tolerance specifications are relatively less critical particularly as to the channel area for the second embodiment with respect to the first embodiment, it is less costly to make. It will be further appreciated that the second embodiment is relatively fast as to the prior art, but relatively less fast than the first embodiment. The second embodiment can be used for relatively high-voltage applications in addition to low voltage applications by splitting the gate into two sections, that is, a control gate and a field plate. It will also be appreciated that an E-Beam process could be substituted for the photolithographic process or similar selective removing process.

While the above referenced embodiment of the invention has been described in considerable detail with respect to the IMOS device 5, it will be appreciated that other modifications and variations therein may be made by those skilled in the art without departing from the true spirit and scope of the invention.

What is claimed is:

1. An all implanted MOS transistor having a DMOS-like structure formed in a substrate and having an implanted source area and an implanted drain area, comprising:

(a) a dielectric layer formed to a predetermined thickness on the surface of the substrate between the implanted source and drain areas, said dielectric layer having an edge adjacent to the source area which is beveled to a predetermined gradient with respect to said surface of said substrate; and (b) channel area means in said substrate extending from an edge of said source area toward said drain area, said channel area being disposed relatively beneath at least the thinner portions of said beveled edge of said dielectric layer, said channel area having a fixed length measured along said surface of said substrate from said edge of said source area which is relatively proportional to the predetermined gradient of the beveled edge of said dielectric layer.

2. The all implanted MOS transistor of claim 1 wherein said dielectric layer may be deposited.

3. The all implanted MOS transistor of claim 1 wherein said dielectric layer may be grown.

4. The all implanted MOS transistor of claim 1 wherein said dielectric layer is an oxide.

5. The all implanted MOS transistor of claim 1 wherein said dielectric layer is silicon dioxide.

6. The all implanted MOS transistor of claim 1 wherein said dielectric layer is an oxide and nitride sandwich.

7. The all implanted MOS transistor of claim 1 wherein said dielectric layer is an oxide and polysilicon sandwich.

8. The all implanted MOS transistor of claim 1 wherein said dielectric layer is a first layer of oxide of predetermined thickness disposed on and in operative contact with the substrate for operation as an electrical insulator and a second layer of conducting material of predetermined thickness disposed on and in operative contact with the first layer for operation as a gate.

9. The all implanted MOS transistor of claim 8 wherein said first layer of oxide is silicon-dioxide.

10. The all implanted MOS transistor of claim 8 wherein said second layer is polysilicon.

11. The all implanted MOS transistor of claim 1 wherein said channel area means is relatively p doped.

* * * * *